United States Patent
Dedic et al.

(10) Patent No.: US 9,966,923 B2
(45) Date of Patent: May 8, 2018

(54) INTEGRATED CIRCUITRY

(71) Applicant: SOCIONEXT INC., Yokohama-shi, Kanagawa (JP)

(72) Inventors: Ian Juso Dedic, Middlesex (GB); Saul Darzy, Middlesex (GB)

(73) Assignee: SOCIONEXT INC., Yokohama (JP)

( * ) Notice: Subject to any disclaimer, the term of this patent is extended or adjusted under 35 U.S.C. 154(b) by 0 days. days.

(21) Appl. No.: 15/456,103

(22) Filed: Mar. 10, 2017

(65) Prior Publication Data
US 2017/0264259 A1 Sep. 14, 2017

(30) Foreign Application Priority Data

Mar. 11, 2016 (EP) .................... 16160043

(51) Int. Cl.
*H03M 1/66* (2006.01)
*H03H 7/38* (2006.01)
*H03K 19/0175* (2006.01)
*H03M 1/00* (2006.01)

(52) U.S. Cl.
CPC ........... *H03H 7/38* (2013.01); *H03K 19/0175* (2013.01); *H03M 1/00* (2013.01)

(58) Field of Classification Search
CPC ........ H03H 7/38; H03M 1/00; H03K 19/0175
USPC ............................. 341/144; 326/30
See application file for complete search history.

(56) References Cited

U.S. PATENT DOCUMENTS 7,005,939 B2 * 2/2006 Zerbe .................. H01L 27/0251
333/100
8,947,840 B1 * 2/2015 Milirud .................. H02H 9/046
361/56
2008/0001671 A1 1/2008 Cao

FOREIGN PATENT DOCUMENTS

| EP | 2 211 468 A1 | 7/2010 |
| EP | 2 849 345 A1 | 3/2015 |
| WO | WO 93/16493 A1 | 6/1993 |

OTHER PUBLICATIONS

Extended European Search report for relating European Patent application 16160043.2 dated Sep. 19, 2016.

* cited by examiner

*Primary Examiner* — Khai M Nguyen
(74) *Attorney, Agent, or Firm* — Arent Fox LLP

(57) ABSTRACT

There is disclosed herein integrated circuitry, comprising a signal path connected to a connection pad, for connection to external circuitry; and a termination circuit connected between the signal path and a voltage reference, wherein the termination circuit comprises a resistor and an inductor. The resistor and the inductor are connected together so as to compensate for parasitic capacitance associated with the connection pad. The signal path may carry an output signal from high-speed circuitry such as digital-to-analog converter circuitry.

14 Claims, 5 Drawing Sheets

INTEGRATED CIRCUITRY

This application claims priority to European Patent Application No. 16160043.2, filed on Mar. 11, 2016. The disclosure of the priority application is incorporated in its entirety herein by reference.

The present invention relates to integrated circuitry, in particular to integrated circuitry configured to improve the frequency-response (and thus performance) of high-speed circuitry. For example, the high-speed circuitry may be analogue-to-digital converter (ADC) or digital-to-analogue converter (DAC) circuitry.

Examples of such ADC circuitry are described in detail in EP 2211468, the entire contents of which are incorporated herein by reference. Examples of such DAC circuitry are described in detail in EP 2849345, the entire contents of which are incorporated herein by reference.

FIG. 1 presents example step response and frequency response graphs, indicating problems identified in such ADC and DAC circuitry.

For the sake of argument, it may be assumed that a target "ideal" step response is one which rises immediately to 100% of full scale as indicated, i.e. to logic high, and that an "ideal" frequency response bandwidth is one in which a target −3 dB point is achieved at 20 GHz as an example. This bandwidth (DC to 20 GHz) is very wide.

It was found in such existing circuitry, designed to have such an "ideal" target step response and target frequency response bandwidth that the "actual" performance was as indicated in FIG. 1, i.e., with a lower −3 dB point, e.g., at 16 GHz, and a corresponding step response rising quickly to around 90-95% of the ideal value and then creeping up to 100% from there.

Such performance issues could potentially come from anywhere in the high-speed circuitry, leading to a complex design problem. Given the particularly wideband performance desired (e.g., DC to 20 GHz as in FIG. 1), it is difficult to tune out the problems, given that for example a digital filter may need a lot of taps to compensate for the error. This is to be contrasted with narrowband (e.g. radio frequency (RF)) applications where such digital filtering may be practical.

It is desirable to solve some or all of the above problems, in particular to provide such integrated circuitry with improved wideband and step response performance.

According to an embodiment of a first aspect of the present invention there is provided integrated circuitry, comprising: a signal path connected to a connection pad, for connection to external circuitry; and a termination circuit connected between the signal path and a voltage reference, wherein the termination circuit comprises an inductor.

The termination circuit may comprise a resistor and an inductor. The inductor, or the resistor and the inductor, may be connected (together) so as to compensate for parasitic capacitance at, or associated with, or of, the connection pad. Such compensation advantageously has been found to address the performance problems discussed above.

The resistor and inductor of the termination circuit may be connected in series between the signal path and the voltage reference. The termination circuit may comprise first and second resistors connected in series (directly) between the signal path and the voltage reference, wherein the inductor is connected in parallel with one of the resistors.

The resistance of the first resistor may be substantially larger or much larger than the resistance of the second resistor, and the inductor may be connected in parallel with the second resistor. For example, the resistance of the first resistor may be 5 to 10 times larger than that of the second resistor. The ratio of resistances of the resistors may be same as the "step response creep-up" size. For example, if this is 10% then the ratio may be 10:1, if this is 5% then the ratio may be 20:1. In practice, the error is usually less than 10% so the ratio may be 10:1 or more.

The signal path may be a signal output path, for example an analogue output path. The signal path may be a signal input path, for example an analogue input path.

The termination circuit may be connected between the signal path and a low or ground (logic low) voltage reference (i.e. a voltage reference source) or between the signal path and a high or VDD (logic high) voltage reference. Effectively, the termination circuit may be connected between the signal path and AC ground.

The termination circuit may be connected between the signal path and a substrate of the integrated circuitry. The signal path may be implemented as a transmission line.

The termination circuit may be a passive termination circuit, in that it comprises (only) passive components. The termination circuit may comprise active components in some embodiments. The resistors and inductors may be variable resistors and inductors in some embodiments, enabling the above performance issues to be tuned out after fabrication. Alternatively, they may be fixed-value components, with the performance issues being tuned out through design of the integrated circuitry.

The connection pad may be a metalized connection pad or land, for example for connection to external circuitry. The connection pad may be referred to as an input/output pad or land.

A resistance of the substrate of the integrated circuitry may be set to be high, or as high as possible. A resistance of the substrate of the integrated circuitry may be set to be substantially higher, typically 10 to 20 times higher, than a resistance of the termination circuit.

The circuit block may comprise digital-to-analogue converter circuitry and/or analogue-to-digital converter circuitry.

According to an embodiment of a second aspect of the present invention there is provided digital-to-analogue converter circuitry or analogue-to-digital converter circuitry, comprising integrated circuitry according to the aforementioned first aspect of the present invention.

According to an embodiment of a third aspect of the present invention there is provided an IC chip, such as a flip chip, comprising integrated circuitry according to the aforementioned first aspect of the present invention, or digital-to-analogue converter circuitry or analogue-to-digital converter circuitry according to the aforementioned second aspect of the present invention.

The present disclosure extends to method aspects corresponding in scope with the apparatus aspects, and will be understood accordingly.

Reference will now be made, by way of example only, to the accompanying drawings, of which:

FIG. 1, mentioned above, presents example step response and frequency response graphs relating to previously-considered circuitry;

FIG. 2 is a schematic diagram representing integrated circuitry useful for understanding embodiments of the present invention;

FIG. 3 presents a frequency response graph showing a change in input impedance over frequency;

Figure 1:
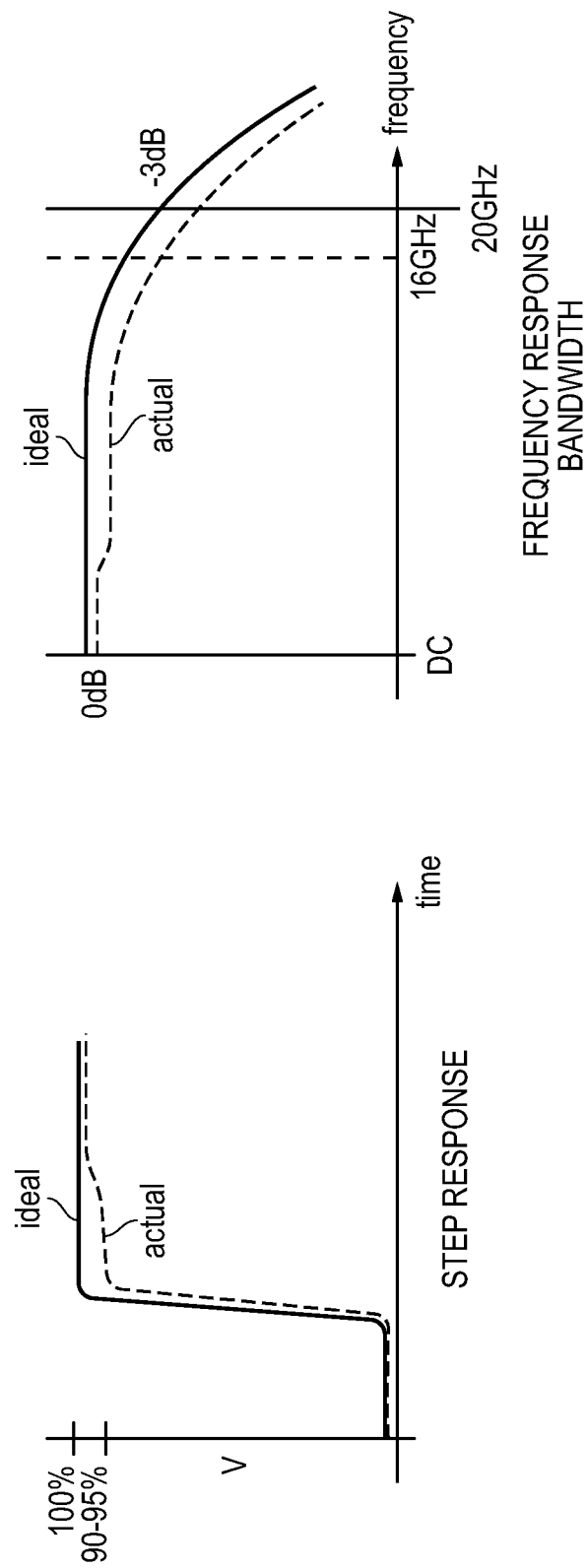

Integrated circuitry 1 comprises a high-speed, wideband circuitry block 2, an input or output signal line 4, a connection pad 6, a termination resistor 8, and a substrate 10. Also shown by dashed-line connection is a capacitor $C_{PAD}$ 12, representing the parasitic capacitance of the connection pad 6.

Incidentally, although focus is placed on analogue output signal lines here it will be appreciated that the present invention is equally applicable to analogue input signal lines, and the present disclosure will be understood accordingly.

The connection pad 6 may be a metalized connection pad or land, useful as an external terminal of the circuitry. For example the connection pad 6 may be suitable to be soldered to a connection pad in another circuit or on a carrier substrate. For example, circuitry 1 may be implemented as a flip chip for connection via one or more such connection pads to a substrate of a flip-chip package.

For the sake of further explanation, it is assumed that the high-speed circuitry block 2 is DAC or ADC circuitry, for example as mentioned above.

Figure 2:
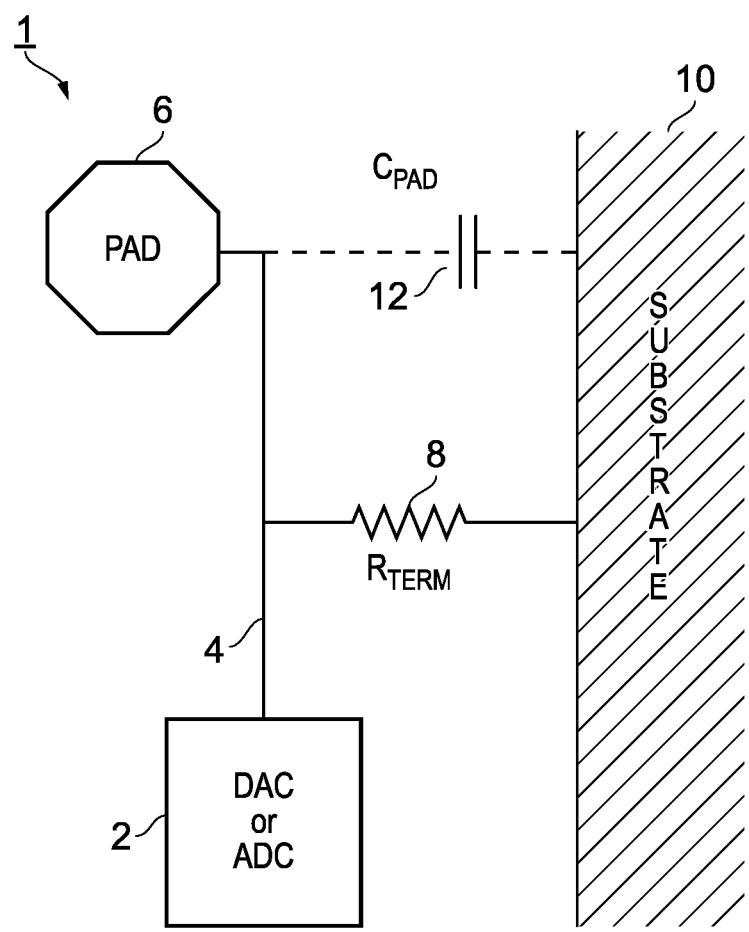
FIG. 2 is a schematic diagram representing integrated circuitry 1 useful for understanding embodiments of the present invention. The integrated circuitry is shown in a simplified form.

As indicated in FIG. 2, and taking an output signal line as an example, the output signal line 4 connects an output of the circuitry block 2 to the connection pad 6. In the case of DAC circuitry, this could be an overall analogue output of that circuitry. The termination resistor 8, for example a 50Ω resistor, connects the signal line 4 to the substrate 10, i.e. to ground supply, to terminate that signal line.

Of importance here is the parasitic capacitance of the connection pad 6, identified by the present inventors as contributing to the performance problems mentioned above. This parasitic capacitance is modelled here for the benefit of explanation as the discrete capacitor $C_{PAD}$ 12 connected between the connection pad 6 and the substrate 10. However, it will be understood that this represents a parasitic capacitance, and that no discrete capacitor 12 is provided in the circuitry 1 as such.

This clear insight—the identification and isolation of capacitor $C_{PAD}$ 12 as being a source of the performance problems discussed above—is of course a significant contribution and step towards the embodiments disclosed herein. For example, it will be appreciated that circuitry block 2 itself may be very complex, having many thousands of components, with the overall circuitry 1 being similarly complex. Note that the pad 6 will also have some resistance in practice, which may also be taken into account.

Figure 3:
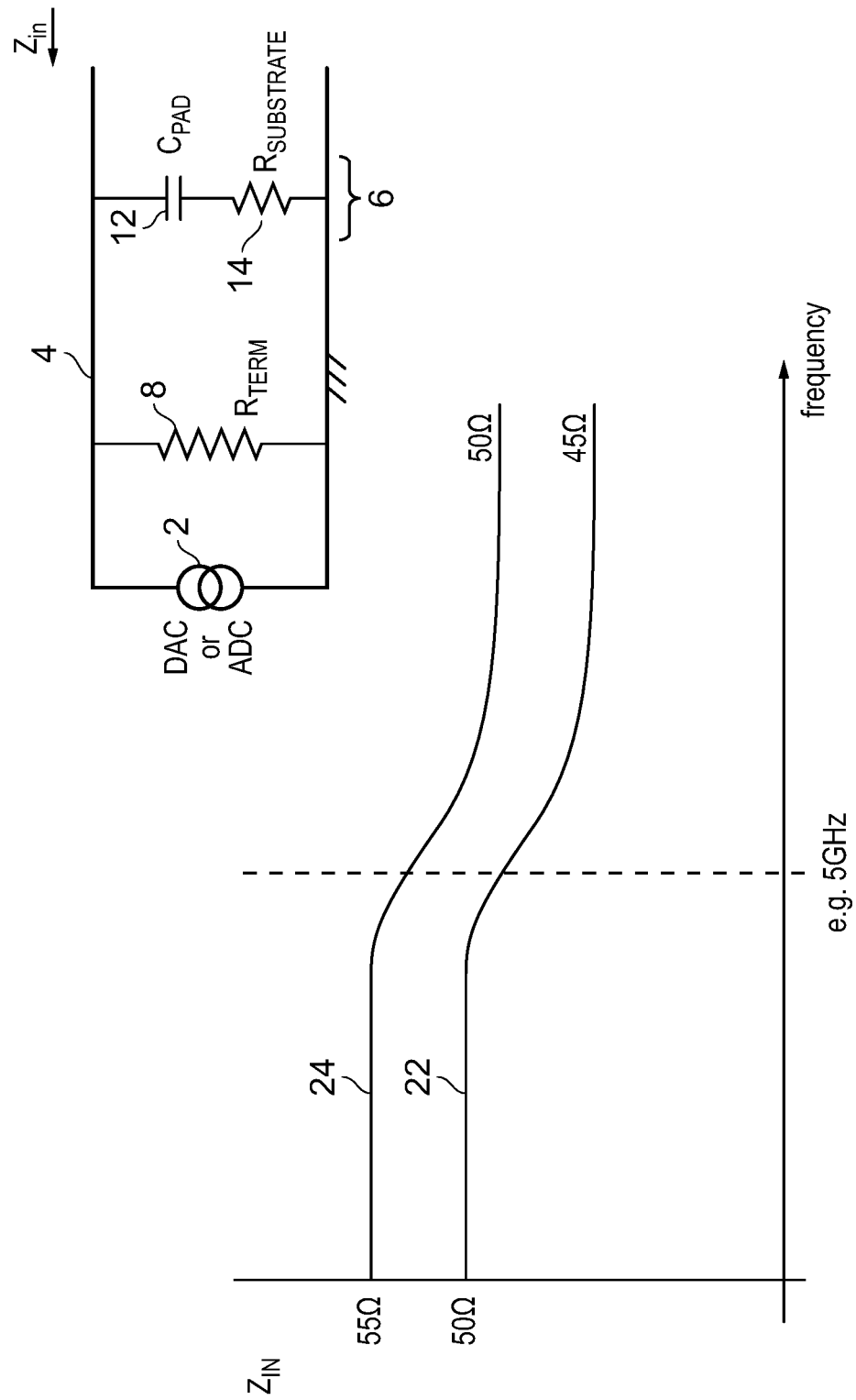

FIG. 3 presents a frequency response graph showing how the input impedance may vary over frequency given the circuitry 1 of FIG. 2. A representation of the circuitry 1 is shown in the upper right-hand corner with the circuit block 2 modelled as a current source 2 and with a resistance $R_{SUBSTRATE}$ 14 modelling the resistance of the substrate explicitly shown in series between the capacitor 12 (parasitic pad capacitance) and ground.

Assuming (as a running example) a target input impedance $Z_{IN}$ of 50Ω, and thus with the termination resistor 8 being a 50Ω resistor and the signal line 4 being 50Ω transmission line, the lower trace 22 in FIG. 3 shows the effect of capacitor 12. The 50Ω termination resistor appears as such at DC and low frequencies, but as a 45Ω termination resistor at high frequency. The transition is shown here at around 5 GHz merely as an example, and the value 450 is also simply an example.

The upper trace 24 in FIG. 3 shows in this example that by employing a 55Ω termination resistor the target 50Ω input impedance may be experienced at high frequency. However, this may be unsatisfactory given the desired wideband performance.

Figure 4:
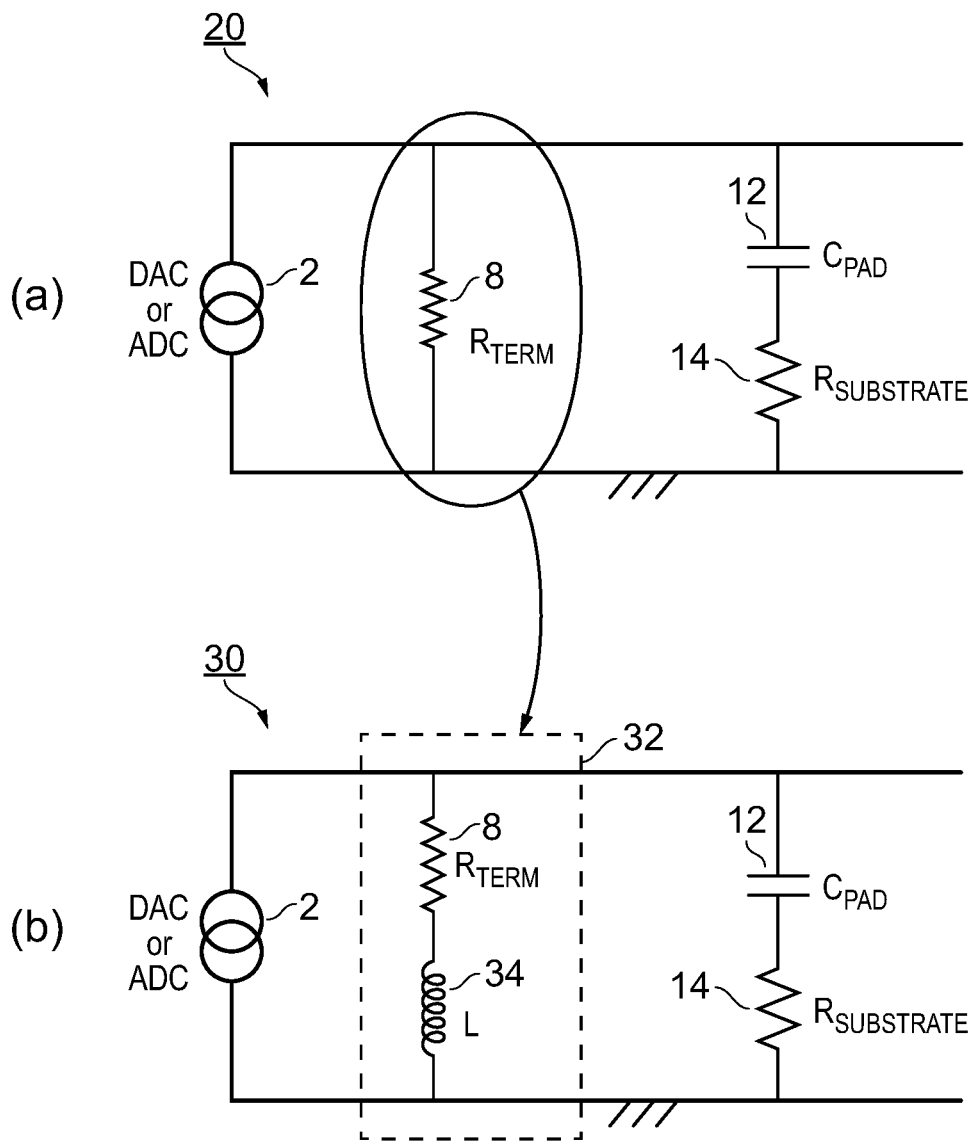
FIG. 4 is a schematic diagram of example circuitry alongside existing circuitry for comparison purposes.

FIG. 4 is a schematic diagram showing representative circuitry 20 and 30 in order to better explain embodiments of the present invention.

Representative circuitry 20 of FIG. 4(a) corresponds to that shown in FIG. 3 and is provided for comparison purposes.

FIG. 4(b) presents representative circuitry 30. As can be seen from FIG. 4, compared to representative circuitry 20, in representative circuitry 30 the termination resistor 8 has been replaced with a termination circuit 32. The termination circuit 32 comprises termination resistor 8 and an inductor 34. For example, the termination resistance itself may have some inductance. Although the termination resistors 8 are denoted in the same way in FIGS. 4(a) and 4(b), their resistance values may be different from one another.

By maximising or increasing the resistance of the substrate $R_{SUBSTRATE}$ 14 in the circuitry 30, for example relative to that in circuitry 20, it is effectively possible to minimise the impact of the parasitic capacitance $C_{PAD}$ 12 of the connection pad 6. The resistance of the substrate may be set when configuring the eventual fabrication of the integrated circuitry, in relation to the materials and processes used. With the resistance of the substrate itself usually fixed by the fabrication process, beyond configuring the fabrication process another possibility is to have a big gap between the pad and other circuits (which adds area, and is often undesirable or even impossible in a practical layout).

Figure 5:
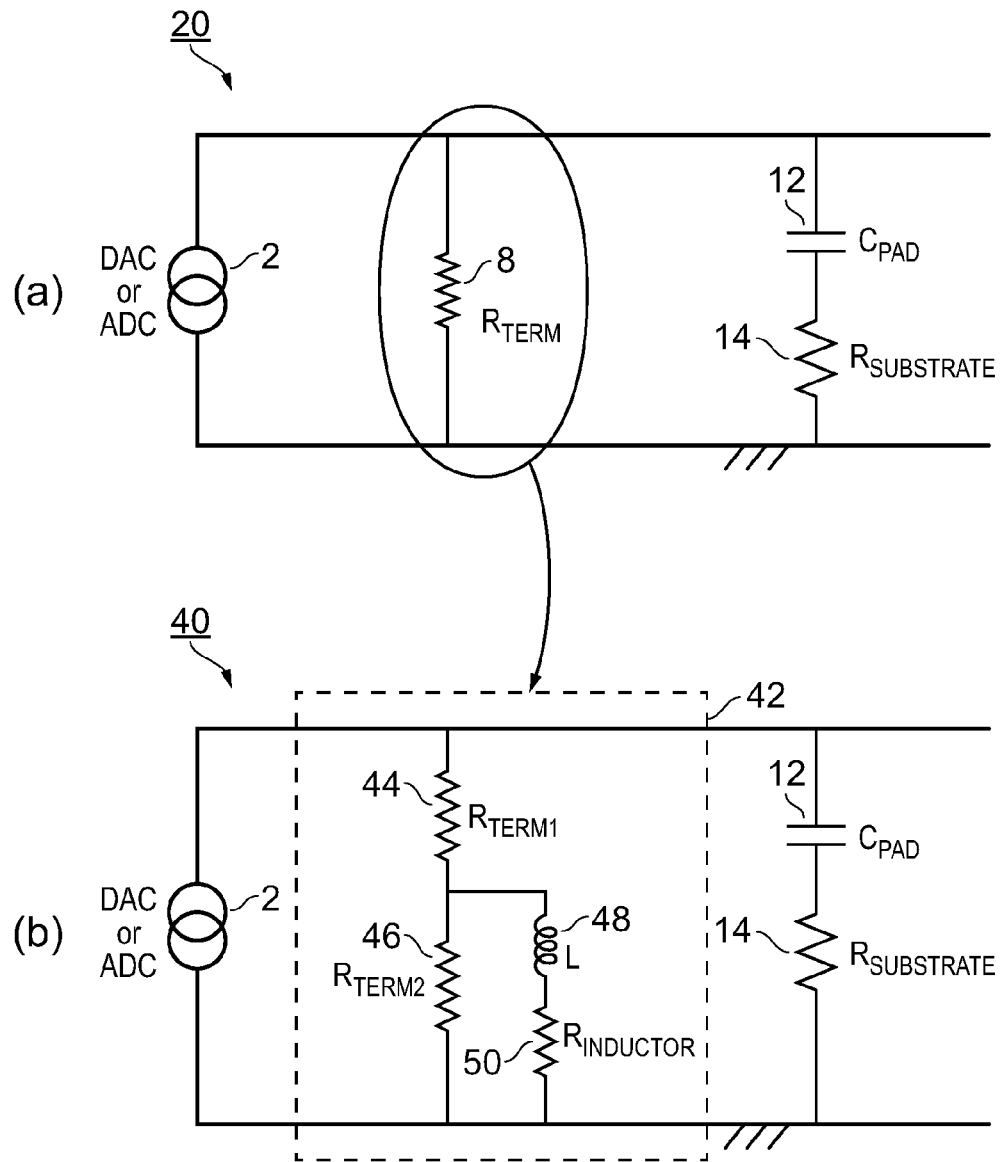
FIG. 5 is another schematic diagram of example circuitry alongside existing circuitry for comparison purposes.

FIG. 5 is a schematic diagram showing representative circuitry 20 and 40 also in order to better explain embodiments of the present invention.

Representative circuitry 20 of FIG. 5(a) corresponds to that shown in FIGS. 3 and 4(a) and is again provided for comparison purposes.

FIG. 5(b) presents representative circuitry 40, which embodies the present invention. As can be seen from FIG. 5, compared to representative circuitry 20, in representative circuitry 40 the termination resistor 8 has been replaced with a termination circuit 42. The termination circuit 42 comprises a first termination resistor 44, a second termination resistor 46 and an inductor 48. Also indicated in termination circuit 42 for the benefit of explanation is the real resistance of the (in practice, non-ideal) inductor 48, denoted $R_{INDUCTOR}$ 50. However, it will be appreciated that this resistance is a property of the non-ideal inductor in practice and not a separate discrete resistance as such.

The first and second termination resistors 44 and 46 are connected in series with one another and in place of the termination resistor 8 of the representative circuitry 20. The inductor 48 is connected in parallel with the second termination resistor 46. The real resistance 50 of the inductor 48 is shown in series with the inductor 48 (as an ideal circuit element) itself. Thus, the combination of elements 50 and 48 correspond to a real non-ideal inductor.

As above, by maximising the resistance of the substrate $R_{SUBSTRATE}$ 14 in the circuitry 40 it is effectively possible to minimise the impact of the parasitic capacitance $C_{PAD}$ 12 of the connection pad.

By setting the values of the indicated components it is possible to configure the circuitry 40 to compensate for the parasitic capacitance $C_{PAD}$ 12 of the connection pad 6.

For example, if $R_{SUBSTRATE}$ is 500Ω and $R_{TERM}$(ideal) is 50Ω, and if step error is 10%, this may require $R_{TERM}$ to increase by $\Delta R=5\Omega$ at high frequencies. Without $R_{INDUCTOR}$, this would give $R_{TERM1}$=50 ohms and $R_{TERM2}$=5 ohms. The two time constants (RC and LJR) need to match for effective compensation. If $C_{PAD}$=60 fF, then RC=$R_{SUBSTRATE}*C_{PAD}$=500 Ω*60 fF=30 ps=L/$R_{TERM2}$ which gives L=150 pH. With $R_{INDUCTOR}$=30, to keep $\Delta R=5\Omega$ this gives $R_{TERM2}$=8Ω. This means L=240 pH and $R_{TERM1}$=47Ω (50Ω-$R_{INDUCTOR}$).

Example values therefore could be:
$R_{TERM1}$=47 Ω
$R_{TERM2}$=8 Ω
L=240 pH
$R_{INDUCTOR}$=3 Ω
$C_{PAD}$=60 fF
$R_{SUBSTRATE}$=500 Ω

It will be appreciated that one or more of the first and second termination resistors 44 and 46 and the inductor 48 (FIG. 5(b)) could be implemented as variable components, i.e. as variable resistors or inductors. This would enable the performance problems to be tuned out in a particular circuit, for example dynamically if need be. However, in practice it may be that fixed components designed to tune out the performance problems may be used. Thus, the termination circuit 42 may be implemented as dynamic-value (i.e. adjustable) or fixed-value circuit. Such circuits may in some embodiments include active components and in other embodiments only passive components.

It will be appreciated that the circuitry embodying the present invention could be provided in the form of an IC chip having high-speed circuitry 20. The high-speed circuitry 20 could comprise mixed-signal circuitry such as DAC or ADC circuitry. Embodiments of the present invention thus may be represented by the circuitry 1 of FIG. 2, except with the termination resistor 8 replaced by the termination circuit 32 or 42.

Such a chip may have one or more contact or connection pads corresponding to connection pad 6, and thus the present invention may be embodied in respect of one, a plurality, or in respect of all of such connection pads.

It will also be appreciated that the circuitry disclosed herein could be described as a DAC or ADC. Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Integrated circuitry, comprising:
   a signal path connected to a connection pad, for connection to external circuitry; and
   a termination circuit connected between the signal path and a voltage reference,
   wherein:
   the termination circuit comprises first and second resistors connected in series between the signal path and the voltage reference, and an inductor connected in parallel with one of the resistors, so as to compensate for parasitic capacitance associated with the connection pad.

2. The integrated circuitry of claim 1, wherein the resistance of the first resistor is larger than the resistance of the second resistor, and wherein the inductor is connected in parallel with the second resistor.

3. The integrated circuitry of claim 1, wherein the signal path is a signal output path or a signal input path.

4. The integrated circuitry of claim 1, wherein the termination circuit is connected between the signal path and a ground voltage reference.

5. The integrated circuitry of claim 1, wherein the termination circuit is connected between the signal path and a substrate of the integrated circuitry.

6. The integrated circuitry of claim 1, wherein the signal path is implemented as a transmission line.

7. The integrated circuitry of claim 1, wherein the termination circuit is a passive termination circuit.

8. The integrated circuitry of claim 1, wherein the connection pad is a metalized connection pad or land.

9. The integrated circuitry of claim 1, wherein a resistance of the substrate of the integrated circuitry is higher than a resistance of the termination circuit.

10. Digital-to-analogue converter circuitry or analogue-to-digital converter circuitry, comprising the integrated circuitry of claim 1.

11. An IC Chip, comprising the digital-to-analogue converter circuitry or analogue-to-digital converter circuitry of claim 10.

12. The IC chip of claim 11, wherein the IC chip is a flip chip.

13. An IC chip, comprising the integrated circuitry of claim 1.

14. The IC chip of claim 13, wherein the IC chip is a flip chip.

* * * * *